(12) United States Patent
Curran et al.

(10) Patent No.: US 11,421,317 B2
(45) Date of Patent: Aug. 23, 2022

(54) FIXED AND PORTABLE COATING APPARATUSES AND METHODS

(71) Applicant: University of Houston System, Houston, TX (US)

(72) Inventors: Seamus Curran, Pearland, TX (US); Nigel Alley, Houston, TX (US); Kang-Shyang Liao, Houston, TX (US); Amrita Haldar, Dublin, CA (US)

(73) Assignee: University of Houston System, Houston, TX (US)

( * ) Notice: Subject to any disclaimer, the term of this patent is extended or adjusted under 35 U.S.C. 154(b) by 305 days.

(21) Appl. No.: 16/553,995

(22) Filed: Aug. 28, 2019

(65) Prior Publication Data

US 2020/0063255 A1 Feb. 27, 2020

Related U.S. Application Data

(62) Division of application No. 14/301,643, filed on Jun. 11, 2014, now Pat. No. 10,435,785.

(Continued)

(51) Int. Cl.
*C23C 16/02* (2006.01)
*C23C 16/52* (2006.01)
(Continued)

(52) U.S. Cl.
CPC .............. *C23C 16/02* (2013.01); *B05D 1/60* (2013.01); *B05D 3/064* (2013.01); *B05D 3/142* (2013.01); *B05D 5/08* (2013.01); *C03C 17/30* (2013.01); *C23C 14/12* (2013.01); *C23C 16/0227* (2013.01); *C23C 16/44* (2013.01); *C23C 16/448* (2013.01); *C23C 16/4412* (2013.01); *C23C 16/452* (2013.01); *C23C 16/458* (2013.01); *C23C 16/45561* (2013.01); *C23C 16/482* (2013.01); *C23C 16/50* (2013.01); *C23C 16/52* (2013.01); *C23C 16/545* (2013.01);
(Continued)

(58) Field of Classification Search
None
See application file for complete search history.

(56) References Cited

U.S. PATENT DOCUMENTS 4,383,349 A 5/1983 Marshall
5,431,734 A 7/1995 Chapple-Sokol et al.
(Continued)

FOREIGN PATENT DOCUMENTS

JP 10-130851 5/1998
JP 2003-147529 5/2003
JP 2003-286573 10/2003

*Primary Examiner* — Joel G Horning
(74) *Attorney, Agent, or Firm* — Shackelford, Bowen, McKinley & Norton, LLP

(57) ABSTRACT

A system and method for depositing a coating may comprise a coating chemical reactor, surface activation component, and a deposition component. A target surface may be prepared for deposition with the surface activation component. The coating chemical reactor may comprise a coating chemical dispenser and a coating chemical verifier that prepares the coating chemical for deposition. The coating chemical verifier may utilize an optical excitation source and at least one optical detector, wherein chemical substances are identified by unique signatures composed of binary code. The coating chemical may be received by the deposition component to depositing the coating chemical on the target surface.

18 Claims, 7 Drawing Sheets

Related U.S. Application Data

(60) Provisional application No. 61/833,578, filed on Jun. 11, 2013.

(51) Int. Cl.

| | |
|---|---|
| B05D 1/00 | (2006.01) |
| B05D 3/06 | (2006.01) |
| B05D 3/14 | (2006.01) |
| B05D 5/08 | (2006.01) |
| C03C 17/30 | (2006.01) |
| C23C 14/12 | (2006.01) |
| C23C 16/44 | (2006.01) |
| C23C 16/448 | (2006.01) |
| C23C 16/455 | (2006.01) |
| C23C 16/48 | (2006.01) |
| C23C 16/54 | (2006.01) |
| D06B 1/08 | (2006.01) |
| D06M 10/02 | (2006.01) |
| D06M 10/04 | (2006.01) |
| C23C 16/452 | (2006.01) |
| C23C 16/458 | (2006.01) |
| C23C 16/50 | (2006.01) |

(52) U.S. Cl.
CPC .............. *D06B 1/08* (2013.01); *D06M 10/025* (2013.01); *D06M 10/04* (2013.01); *C03C 2218/31* (2013.01)

(56) References Cited

U.S. PATENT DOCUMENTS

| | | |
|---|---|---|
| 5,445,699 A | 8/1995 | Kamikawa et al. |
| 6,117,482 A | 9/2000 | Kawahara et al. |
| 6,228,557 B1 | 5/2001 | Blanchard et al. |
| 6,284,050 B1 | 9/2001 | Shi et al. |
| 2002/0022087 A1 | 2/2002 | Satake et al. |
| 2002/0093558 A1 | 7/2002 | Hauptmann |
| 2003/0232381 A1 | 12/2003 | Vann et al. |
| 2006/0180272 A1 | 8/2006 | Baldauf |
| 2006/0284118 A1 | 12/2006 | Asmussen et al. |
| 2010/0304132 A1 | 12/2010 | Kobrin et al. |
| 2011/0139272 A1 | 6/2011 | Matsumoto et al. |
| 2011/0268911 A1 | 11/2011 | Zheng et al. |

Textile Bending to enhance vapor access through depth of material

Brushing Roller Assisted Nozzle Vapor Dispenser Array

Compressed Air Assisted Nozzle Vapor Dispenser Array

Textile Bending and Brushing Roller Assisted Nozzle Vapor Dispenser Array

Ⓡ = Roller/Conveyor Belt

Ⓑ = Brushing Roller (c) Trough (with coolant rods only)

(d) Chamber for Solution Treatment System

A: Carpet roll
B: Roller (in blue)
C: Carpet flowing
D: Trough
E: Squeeze rollers
F: Fume hood
G: Ducting
H: AC system
I: Ducting
J: Carpet intake door

FIXED AND PORTABLE COATING APPARATUSES AND METHODS

RELATED APPLICATIONS

This application is a divisional application of U.S. Nonprovisional application Ser. No. 14/301,643, filed on Jun. 11, 2014, which claims priority to U.S. Provisional Patent Application No. 61/833,578, filed on Jun. 11, 2013. The entirety of each of the aforementioned applications is incorporated herein by reference.

STATEMENT REGARDING FEDERALLY SPONSORED RESEARCH

This invention was made with government support under Grant No. DD-N000141110069 from the Office of Naval Research at the US Department of Defense. The government has certain rights in the invention.

FIELD OF THE INVENTION

The present invention is directed to systems and methods for depositing a coating, including deposition with an apparatus providing surface activation and chemical verification.

BACKGROUND OF THE INVENTION

Materials processing and deposition of materials for the purpose of attaining various desired properties and effects have been described. For example, thermal or e-beam evaporation may be used to deposit metal/metal alloy for electrodes or to deposit semiconductors for electronics. The use of high vacuum allows vapor particles to travel directly to the target object (substrate), where they condense back to a solid state. Sputtering is process whereby atoms are ejected from a solid target material due to bombardment of the target by energetic particles (e.g. Ar plasma). Chemical vapor deposition (CVD) and metal-organic chemical vapor deposition (MOCVD or OMVPE or MOVPE) are other processes used to produce high-purity, high-performance solid materials.

However, many deposition processes (including the above processes) may only be capable of performing a single task and may require elaborated equipment(s). For production of complex multi-functional coatings, such as processing and/or depositing two or more materials, the above noted deposition processes cannot easily be achieved, requires multiple steps, or additional complexity. Apparatuses and method for an improved coating process are discussed herein. The apparatus and method may be suitable for producing complex multi-functional coatings while maintaining its basic nature and portability.

SUMMARY OF THE INVENTION

In one embodiment, a coating system may comprise a coating chemical reactor, surface activation component, and a deposition component. A target surface may be prepared for deposition with the surface activation component. The surface activation may be achieved by reaction with ozone, oxygen, hydrogen peroxide, halogens, other reactive oxidizing species, or combinations thereof. The purpose is to create an energetically reactive surface to bind molecules on the surface covalently. In some embodiments, the surface activation may be achieved by ozone plasma generated by intense UV light. In other embodiments, surface activation may be achieved by plasma treatment. In yet another embodiment, surface activation may be achieved by ozone generation using a corona discharge, flame, or plasma.

The coating chemical reactor may comprise a coating chemical dispenser that dispenses the chemical to be coated on a substrate and a coating chemical verifier that prepares and controls the quality of the coating chemical for deposition. The coating chemical verifier may utilize an optical excitation source and at least one optical detector, wherein chemical substances are identified by unique signatures composed of binary code. The coating chemical may be received by the deposition component to depositing the coating chemical on the target surface. In some embodiments, the substrate may absorb a base material, such as a primer, first in order for the coating molecules to covalently link to the absorbent material within or on top of the substrate.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION OF THE INVENTION

Figure 1:
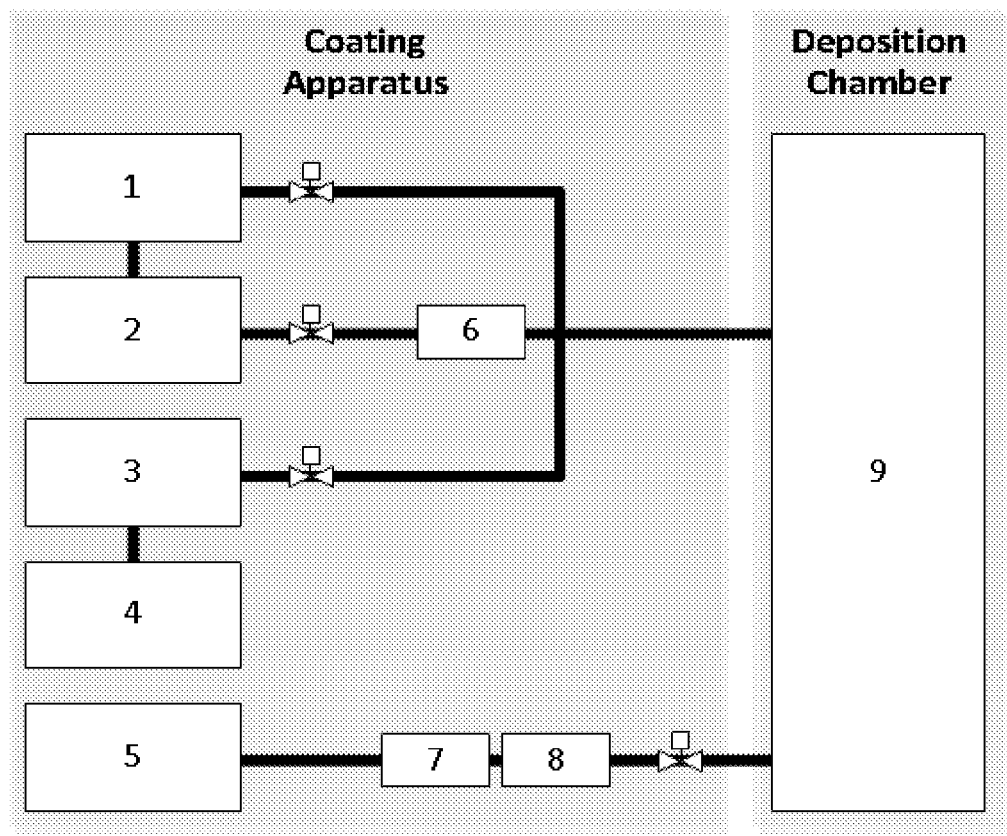
FIG. 1 is an illustrative embodiment of a coating apparatus and deposition chamber.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Improved coating systems and methods are discussed herein. The system and method may be suitable for producing complex multi-functional coatings (including but not limited to hydrophobic or hydrophilic, oleophobic or oleophilic, amphiphobic or amphiphilic, anti-counterfeiting, UV-resistive, anti-reflective, anti-abrasive, flame-resistance, fire-retardant, anti-static, anti-microbial/fungal and anticorrosive, etc.) while maintaining simplicity and portability.

The coating systems and methods discussed herein may be referred to as an All-In-One (AIO) system.

The AIO systems and methods discussed herein may be used to deposit various organic, inorganic or hybrid material systems in solid, solution, or vapor phase as coatings or the like. In some embodiments, the resulting coating may range from about 1 nm to 1 mm in thickness onto a target surface(s). In some embodiment, the application of such coatings may encompass self-cleaning coatings that are hydrophobic, hydrophilic, oleophobic, oleophilic, amphiphilic, and/or amphiphobic. In some embodiment, the application of such coatings may also be applied to anti-counterfeiting measures including but not limited to chemical signature tags or fluorescent/phosphorescent markers. In some embodiment, the application of such coatings may improve UV-resistive properties. In some embodiment, the application of such coatings may improve anti-reflective properties. In some embodiment, the application of such coatings may improve anti-abrasive properties. In some embodiment, the application of such coatings may improve flame-resistance or fire-retardant properties. In some embodiment, the application of such coatings may improve anti-static or electrical properties. In some embodiment, the application of such coatings may improve anti-microbial/fungal properties. In some embodiment, the application of such coatings may improve anticorrosive properties.

FIG. 1 is an illustrative embodiment of a coating apparatus and deposition chamber. The coating apparatus may include coating chemical reactor (1), processing gas supply (2), surface activation apparatus (3), surface activation apparatus gas supply (4), venting or vacuum apparatus (5), heating element (6), NaOH, CaO or $NaHCO_3$ neutralizing filter (7), and/or activated carbon filter (8). Various attachments and connections are made to a deposition chamber (9). The coating chemical reactor (1) controls the processing parameters of the coating chemical being introduced into the deposition chamber (9) including but not limited to carrier gas flow rates, coating chemical concentrations, supply line pressures, system temperatures, and/or the like.

The coating chemical reactor (1) is coupled to the deposition chamber (9) and may supply the desired chemical necessary for depositing a desired coating. The coating chemical reactor (1) may provide a dispenser that precisely provides the amount of coating chemicals necessary for depositing the desired coating and generates reactive chemicals for the deposition process; and a chemical verifier that provides precise quality control and verification the coating chemical concentration. The processing gas supply (2) is coupled to the coating reactor (1), heating element (6), and deposition chamber (9), and may supply the necessary chemical(s) and/or the carrier gas to the coating chemical reactor (1) for depositing the desired coating. The necessary chemicals and/or the carrier gas may be fed to the coating chemical reactor (1) or to the heating element (6) and deposition chamber (9). Output from the coating chemical reactor (1) and processing gas supply (2) to the deposition chamber may be controlled by one or more valves. Non-limiting examples of coating chemicals or processing gas may include chemicals with a general formula of fluoroalkylsilane $[CF_3(CF_2)_a(CH_2)_b]_cSiX_{4-c}$ (where a=0, 1, 2, ... to 20, b=0, 1, 2, ... to 10, c=1, 2 or 3; X=Cl, Br, I or other suitable organic leaving groups); a general formula of fluoroalkylsilane $[CF_3(CF_2)_a(CH_2)_b]_cSiX_{4-c}$ (where a=0, 1, 2, ... to 20, b=0, 1, 2, ... to 10, c=1, 2 or 3; X=Cl, Br, I or other suitable organic leaving groups); a general formula of alkylsilane $[CH_3(CH_2)_a]_bSiX_{4-b}$ (where a=0, 1, 2, ... to 20, b=1, 2 or 3; X=Cl, Br, I or other suitable organic leaving groups); a general formula of alkoxyfluoroalkylsilane $[CF_3(CF_2)_a(CH_2)_b]_cSi[alkoxy]_{4-c}$, (where a=0, 1, 2, ... to 20, b=0, 1, 2, ... to 10, c=1, 2 or 3; where the alkoxy group can be methoxy, ethoxy, propoxy, isopropoxy, butoxy, isobutoxy, or a combination thereof); and a general formula of alkoxyalkylsilane $[CH_3(CH_2)_a]_bSi[alkoxy]_{4-c}$ (where a=0, 1, 2, ... to 20, b=0, 1, 2, ... to 10, c=1, 2 or 3; where the alkoxy group can be methoxy, ethoxy, propoxy, isopropoxy, butoxy, isobutoxy, or a combination thereof). The heating element (6) is used to control the temperature of the carrier gas. The temperature of the heating elements may range from about room temperature (25° C.) to 1000° C.

Surface activation apparatus (3) provides activation of a substrate, if necessary, to improve bonding of the coating, such as by oxidizing the surface of the substrate. In some embodiments, the surface activation apparatus (3) may provide a chamber for receiving the substrate during surface activation, and the substrate may be moved to the deposition chamber (9) to deposit the desired coating after surface activation. In some embodiments, surface activation apparatus (3) may be coupled to deposition chamber (8), surface activation apparatus gas supply (4), or both. The surface activation apparatus gas supply (4) may be used to feed surface activation gas for activating the surface of the substrate when desired. Surface activation of the substrate may be achieved by reaction with ozone, oxygen, hydrogen peroxide, halogens, other reactive oxidizing species, or combinations thereof. In some embodiments, the surface activation apparatus gas supply (4) may also be used to feed gas for any other process described herein. For example, surface activation apparatus gas supply (4) may also supply the carrier gas for the coating chemicals derived from the coating chemical reactor (1). The flow of gas supplied from the surface activation apparatus gas supply (4) and surface activation apparatus (3) to the deposition chamber (9) may be control with a valve. The vent or vacuum apparatus (5) coupled to the deposition chamber (9) is used to control the environment within the deposition chamber (9), such as by removal of unwanted gases from the deposition chamber (9). The vent apparatus (5) may be controlled by on board electronics. A valve between the vent apparatus (5) and deposition chamber (9) may be provided. The neutralizing filter (7) and the activated carbon filter (8) are used to neutralize or remove any harmful chemical by products that may be generated during the surface activation or deposition processes. In some embodiments, neutralizing filter (7) may be a filter suitable for filtering NaOH, CaO, $NaHCO_3$, or combinations thereof.

The first AIO system shown in FIG. 1 may be realized as portable device scalable to the desired application requirements, target surface area, or geometry. This device may be used in the field in any location and incorporates customizable processing parameters, such as temperature control, pressure control, and processing environment gases.

Figure 2:
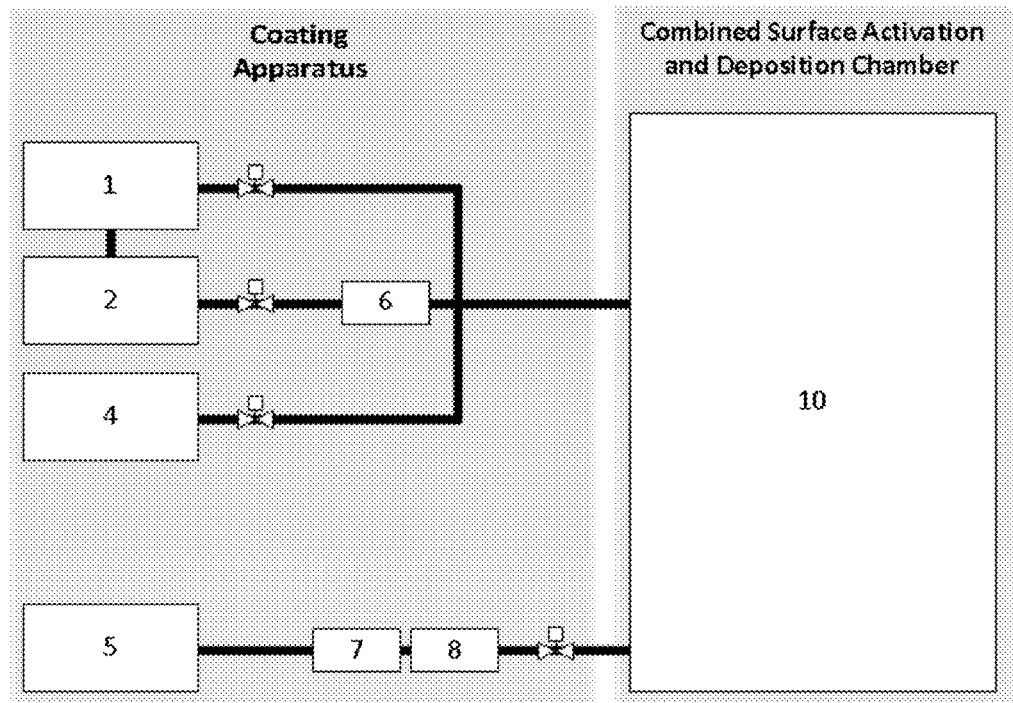
FIG. 2 is an illustrative embodiment of a coating apparatus and combined surface activation and deposition chamber.

FIG. 2 is an illustrative embodiment of a coating apparatus providing a combined surface activation and deposition chamber (10). As in the embodiment discussed in FIG. 1, the coating apparatus in FIG. 2 may include coating chemical reactor (1), processing gas supply (2), surface activation apparatus gas supply (4), venting or vacuum apparatus (5), heating element (6), neutralizing filter (7), and/or activated carbon filter (8), which each serve the same purpose a described previously above. A combined surface activation and deposition chamber (10) may be provides that allows both surface activation and deposition of the desired coating to occur in the same chamber, thereby obviating the need to transfer the substrate from different chambers during surface activation and deposition. Various attachments and connections, similar to the attachments and connections discussed for FIG. 1, are made between the combined surface activation and deposition chamber (10) and coating chemical reactor (1), processing gas supply (2), surface activation apparatus gas supply (4), and venting apparatus (5). One or more valves may be provided between such attachments and connection to allow the connections to be opened, closed, or controlled.

In contrast to FIG. 1, components of a surface activation apparatus (e.g. FIGS. 7-10) are provide by the combined surface activation and deposition chamber (10) in FIG. 2. If surface activation is desired, surface activation apparatus gas supply (4) may provide chemicals to the combined surface activation and deposition chamber (10) that are necessary for improving the bonding of the coating to the substrate. For example, surface activation gases may include ozone, oxygen, hydrogen peroxide, halogens, other reactive oxidizing species, or combinations thereof. Subsequently, deposition of the desired coating may be performed by supplying the chemicals to be coated on the substrate from the coating chemical reactor (1), as discussed previously above. Deposition of the desired coating may occur in the same manner discussed with respect to FIG. 1 in the combined surface activation and deposition chamber (10) in FIG. 2. The coating chemical reactor (1) controls the processing parameters of the coating chemical being introduced into the combined surface activation and deposition chamber (10) including but not limited to carrier gas flow rates, coating chemical concentrations, supply line pressures, system temperatures, and/or the like.

The second AIO system in FIG. 2 may be realized as a fixed, semi-permanent/permanent installation scalable to the desired application requirements/target surface area or geometry allowing for in-line processing of large volumes/throughput of target surfaces.

Figure 3:
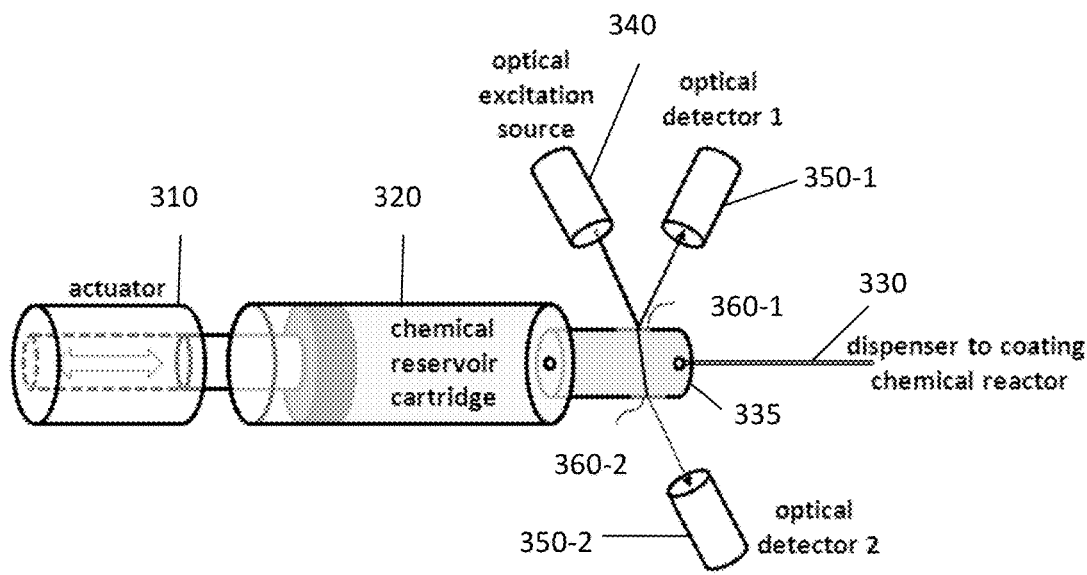
FIG. 3 is an illustrative embodiment of a setup of a first part of a coating chemical reactor, including a coating chemical dispenser and a coating chemical verification apparatus.

FIG. 3 is an illustrative embodiment of a setup of a first part of a coating chemical reactor, including a coating chemical dispenser and a coating chemical verification apparatus. The desired coating chemical(s) are stored in a chemical reservoir cartridge 320. The introduction of the coating chemicals into the deposition chamber or the combined surface activation and deposition chamber (e.g. FIG. 1 or 2) should be a controlled process. This is achieved by the development of a reusable chemical reservoir cartridge 320 that may be used to supply the coating chemical treatment solution for numerous target surfaces depending on the target surface size. The chemical reservoir cartridge 320 is installed into a receptacle on the coating apparatus unit which validates the correct chemical cartridge is in place for the desired coating application via a custom designed coating chemical verification apparatus. A coating chemical reservoir cartridge 320 or appropriate canister is inserted between an actuator 310 and a chemical dispenser 330. A chamber 335 with two optical windows 350-1, 350-2 is placed between the chemical reservoir cartridge 320 and the dispenser 330 and used for the coating chemical verification. The actuator 310 controls the amount of chemical treatment solution that is dispensed into the coating chemical reactor (see FIG. 5 for additional details).

The coating chemical verification apparatus is comprised of an optical excitation source 340 and one or more optical detectors 350-1, 350-2. While the embodiment shown a single excitation source, other embodiments may utilize one or more different optical heads with specific wavelength ranges of excitation sources depending on the resonant signature of each excitation source and response of the molecules excited. For example, in some embodiments, the number of different optical heads may be two or three. Quality control and validation of the coating chemicals are measured by onboard electronics. For example, quality control and validation may use pixilation counting from either a CCD head or using optical filters and silicon detectors, examining the normalized intensity profile and depending on relative intensity when compared to each optical filter barrier. When activated by the insertion of a chemical reservoir cartridge 320, the coating chemical verification apparatus passes the output of the optical excitation source 340 into an optical window 360-1 located next to the chemical reservoir cartridge. The specific molecules inside the chemical reservoir cartridge 320 are excited by the optical excitation source 340. A specific resonance signature is determined by the specific excitation source for that sample. For example, samples that are excited by the UV and result fluorescence or phosphorescence in a certain wavelength may have a different response when the molecules are then excited by an IR source. Specifically, when a mixture of molecules is excited simultaneously by UV and IR sources, some molecules may respond to the UV and emit fluorescence or phosphorescence in the visible of a certain wavelength, while others (anti-stokes molecules) may respond to the IR and emit fluorescence or phosphorescence in the visible but a different wavelength. The optical detectors 350-1, 350-2 can ascertain the degree of optical absorption and/or intensity of emitted energies from the specific molecules through optical windows 360-1 and 360-2 located next to the chemical reservoir cartridge 320. The optical profiles obtained may be normalized to the maximum value observed in order to counteract any small changes in measurement due to variations in the coating chemical concentration. The coating chemical verification apparatus continuously monitors the composition of the chemical treatment solution to ensure the quality of the chemical treatment solution, as well as to verify the presence of any contaminants or foreign chemicals. If the composition of the chemical treatment solution does not match with a preset signature defined by the coating chemical verification apparatus, the dispenser 330 is locked and prevents use. In some embodiments, this may allow the coating chemical verification apparatus to adjust actuator 310 to dispense chemical necessary to comply with the desired chemical concentration if possible. In other embodiments, chamber 335 may be vented to remove chemicals with the incorrect concentration or impurities. Thus, this technique is applicable to a wide range of chemical concentrations.

Magneto-optical detection is also possible where the coating chemical verification apparatus would contain both molecules responsive to optical detection and molecules sensitive to magnetic fields and respond to a specific magnetic field when excited. For example, this could be an amalgam of two differing materials in a composite format, but in the manner of a thin film. The correlation would work by having a specific pulse from an optical source and looking at the time resolved decay of the optical material and can also include a spectral examination of the fluorescence/phosphorescence. Small magnetic molecules, such as carbon nickel compounds, can be mixed with the phosphorescent/fluorescent polymers, the resulting mixture can be excited magnetically and/or respond to the magnetic field. Alternatively, the fluorescent/phosphor molecules can be placed on a magnetic strip containing specific information (acting as an active 'smart' substrate) where the thin film of phosphorescent/fluorescent molecules lie on top. The magnetic film is then pulsed to get a specific magneto response, and depending on that response, the optical system will then receive information on how much power and specific clocking time in the decay signal should be expected. This pulsing optically is then correlated so that both signals have a predetermined result, and so that detection and consequently operation of the system is dependent on these signals.

Figure 4:
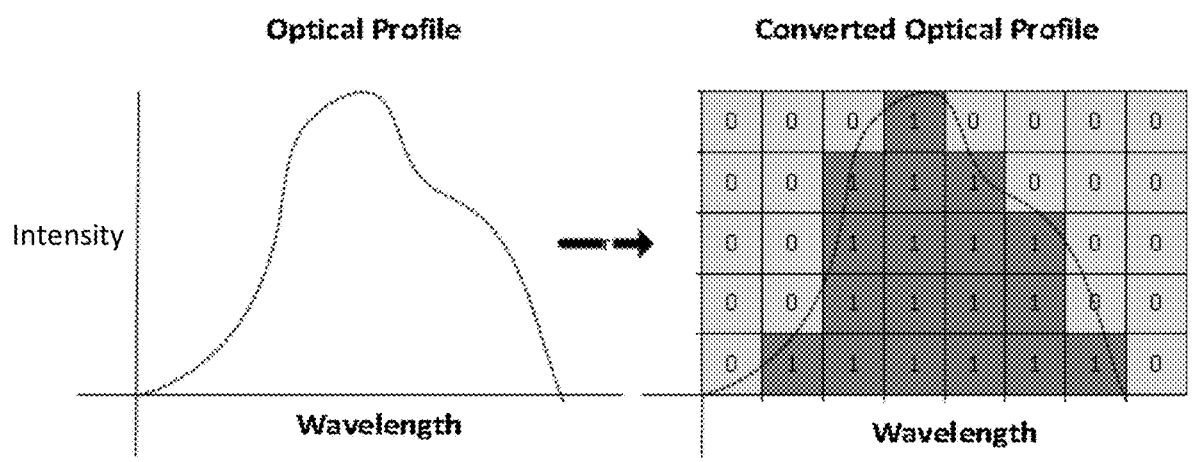
FIG. 4 is a graphical illustrative embodiment of how an optical spectrum may be digitized such that a specific chemical substance may be represented by a unique signature.

FIG. 4 is a graphical illustrative embodiment of how an optical spectrum may be digitized such that one or more specific chemical substance(s) may be represented by a unique signature. An optical spectrum may be digitized such that specific chemical substance(s) may be represented by a unique signature composed of binary numbers either in a matrix or in a sequence of concatenated strings. The information recorded by the optical detectors can be mapped and represented in the form of a binary code that fully describes the particular optical profile measured. It can simply be defined as dividing the optical profile or typical spectrograph into a grid pattern where the resolution is determined by the available memory of the chip used. Any grid square having the majority of its area that is above the curve tracing the Intensity vs. the Energy (or Wavelength) measured by the optical detectors is given a '0'. Any grid square having the majority of its area below the curve tracing the Intensity vs. the Energy (or Wavelength) measured by the optical detectors is given a '1'. The grid may then be represented as a matrix having a particular number of rows and columns defined by the resolution allowable by the available memory. By comparing the measured matrix to a predetermined matrix corresponding the concentrations desired for depositing a desired coating, it is possible to verify if the correct chemical(s) and/or concentration(s) are being used or inserted into the coating apparatus unit.

The coating chemical reactor controls the processing parameters of the coating chemical being introduced into the deposition chamber or the combined surface activation and deposition chamber including but not limited to carrier gas flow rates, coating chemical concentration, supply line pressures, system temperatures or the like.

In some embodiments, the coating chemical reactor may be attached to a material or application specific delivery device used to more precisely deliver the coating chemical to a desire portion of the substrate. This may be achieved by implementation of an array of nozzles connected to the coating chemical reactor. The nozzles may have apertures, in the range in size from $10^{-6}$ to $10^1$ meters, for the dispersing of the coating chemical. This arrangement allows for the coating chemical to be actively positioned or placed within dense fibers of a textile substrate to attain a deeper more uniform application. This may also be performed in conjunction with manipulation of the substrate such as bending, rolling, compressing, and tensioning with the aid of brushing rollers, cards, plates, compressed gas or other suitable aid.

For some specific substrates, a treatment of absorbent molecules (sometimes referred to as a primer) may be required for some coating processes. In some embodiments, the coating systems may be designed to deliver absorbent molecules for the substrate to absorb on the surface or within its structure to form the primer layer. The coating molecules may be subsequently vapor or solution deposited onto the primer layer or the primer/substrate interface, thereby providing a covalent linker. The primer molecules being absorbed may be heat-treated to form a cross-linked structure prior to the deposition of the coating, which provides a firmer linker between the substrate and the primer layer.

Figure 5:
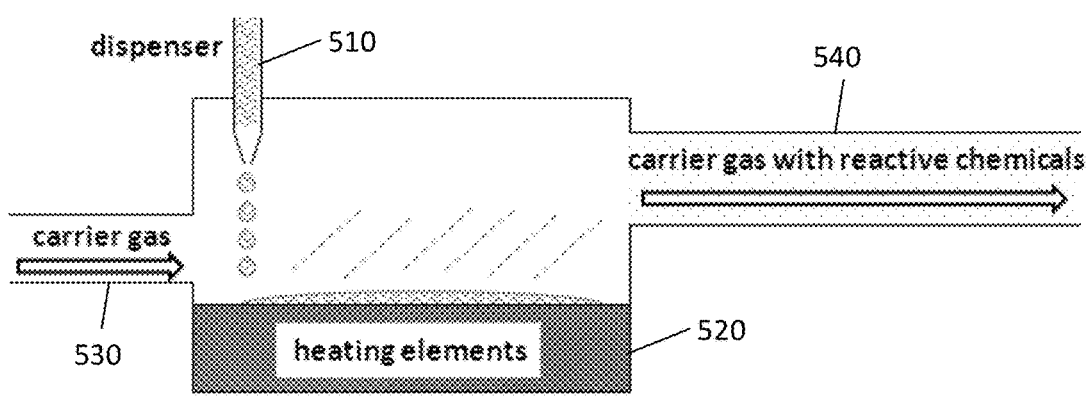
FIG. 5 is an illustrative embodiment of a process of a second part of a coating chemical reactor.

FIG. 5 is an illustrative embodiment of a process of a second part of a coating chemical reactor. The second part of the coating chemical reactor may generate the reactive chemical vapor for conducting the chemical treatment in the deposition chamber or the combined surface activation and deposition chamber. The coating chemical treatment solution, which is composed of reactive chemicals, is injected by a dispenser 510 (from the coating chemical dispenser, e.g. FIG. 3) onto the heating elements 520. Solvent may be included in the chemical treatment solution, such as but not limited to nonpolar aliphatic (e.g. hexanes) or aromatic (e.g. toluene) compounds, which are miscible with the reactive chemicals. The temperature of the heating elements may have an operable range from about room temperature (25° C.) to 1000° C. Once the reactive chemicals are vaporized, the chemical vapor is carried through to the deposition chamber or the combined surface activation and deposition chamber by a carrier gas flow from the input 530 to output 540. The carrier gas, which may be composed of the pure form or a mixture of hydrogen ($H_2$), noble gases such as helium (He), nitrogen ($N_2$), oxygen ($O_2$), argon (Ar), halogens (e.g. $F_2$ and $Cl_2$), carbon dioxide ($CO_2$), hydrocarbons (methane, ethane, propane and ethylene), compressed dry air (a mixture of 20% $O_2$ and 80% $N_2$), or the like. The surface activation may activate the target surface by reaction with ozone or other reactive oxidizing species. Surface activation may also occur via introduction of chemical species in solvated, vapor, or solid phase such that an interaction occurs whereby the target surface is suitably modified into a reactive state. In some embodiments, surface activation may be carried out via ozone generation in proximity to a corona discharge. In some embodiments, surface activation may occur in surface activation apparatus (See surface activation apparatus 3 in FIG. 1). In other embodiments, surface activation may occur in a combined surface activation and deposition chamber (See combined surface activation and deposition chamber 10 in FIG. 2).

Figure 6A:
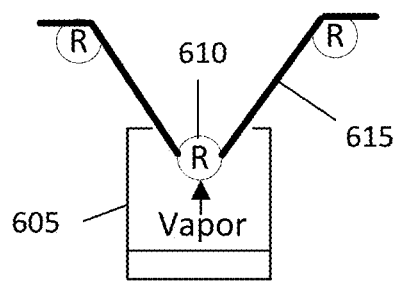
FIGS. 6A-6D are illustrative embodiments of processes for coating chemical reactor attached to material/application specific delivery devices.
Figure 6B:
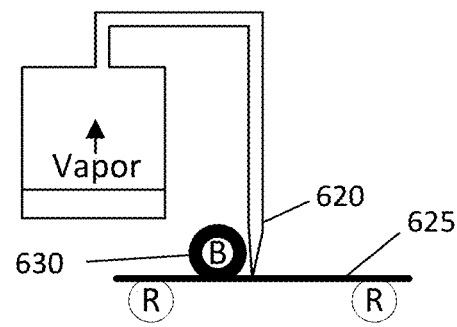
Figure 6C:
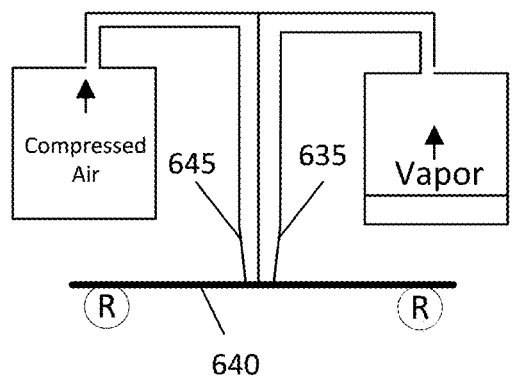
Figure 6D:
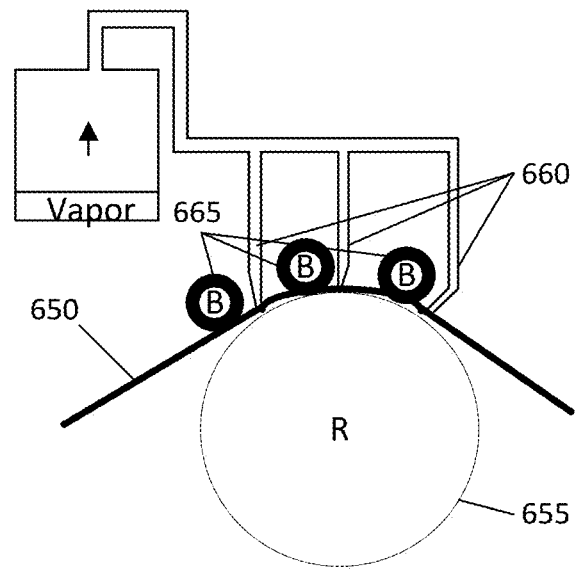

FIGS. 6A-6D are illustrative embodiments of processes for coating chemical reactor attached to material/application specific delivery devices. FIG. 6A displays the use of a vapor chamber 605 aided by a conveyor roller 610 to subject a radius of curvature (ranging from about 1 mm to 5 m) to the textile 615 to allow the vapor to more deeply penetrate into the textile. Bending the textile 615 may enhance vapor access deeper into the material. FIG. 6B displays the vapor being dispensed through a nozzle 620 directed at the textile 625 surface aided by a brushing roller 630 which helps to separate out the textile fibers prior to exposure to the vapor, thereby allowing the vapor to more deeply penetrate into the textile. FIG. 6C displays the vapor being dispensed through a nozzle 635 directed at the textile 640 surface aided by a compressed air nozzle 645 which helps to separate out the textile fibers prior to exposure to the vapor allowing for the vapor to more deeply penetrate into the textile. FIG. 6D displays the textile 650 being pulled over a larger radius conveyor roller 655, which subjects the textile to a large radius of curvatures that allows the vapor to more deeply penetrate into the textile, and the vapor being dispensed through nozzles 660 directed at the textile surface aided by a brushing roller 665, which helps to separate out the textile fibers prior to exposure to the vapor allowing for the vapor to more deeply penetrate into the textile. The rollers/conveying apparatus used to translate the textile through the process have dimensions proportionate to the textile being processed.

Figure 7A:
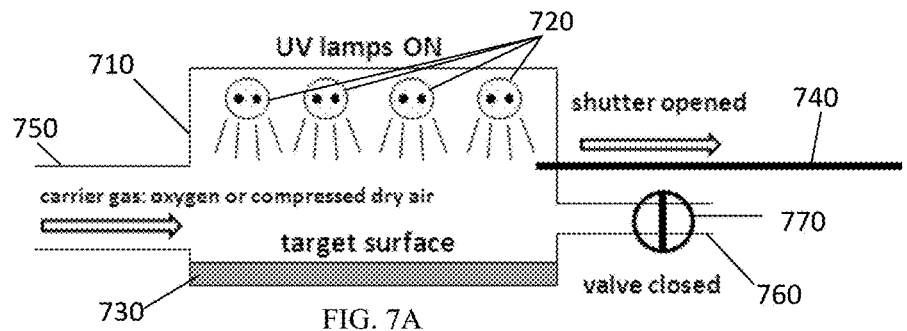
FIGS. 7A-7B are illustrative embodiments of processes for surface activation and deposition.
Figure 7B:
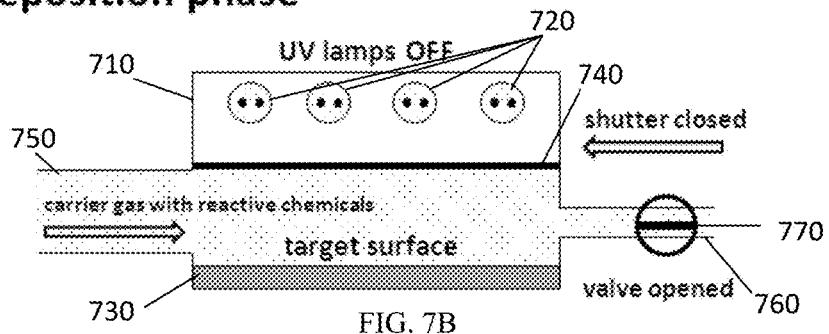

FIGS. 7A and 7B are illustrative embodiments of processes for surface activation and deposition. The chamber illustrated is an exemplary embodiment of the deposition chamber (9) or the combined deposition chamber and surface activation apparatus (10) previously discussed with respect to FIGS. 1 and 2. Chamber 710 may be constructed from a rigid (e.g. anodized Aluminum) or flexible material (e.g. metallized polyester 'Mylar') including but not limited to plastics, metals, ceramics, wood or a combination thereof. The chamber 710 may serve as a deposition chamber or a combined deposition chamber and surface activation chamber. Chamber 710 may have a fixed dimension and capacity or may be adjustable to change shape and size according to the requirements of the target surface(s). The chamber 710 may also allow for modifications to the local environment inside the enclosure, such as but not limited to temperature, pressure, volume, or the like. In some embodiments, chamber 710 may receive processing gases or coating chemicals as required by the specific application.

Surface activation inside the chamber 710 may be achieved via ozone plasma generated by intense UV light sources 720 in the vicinity of the target surface 730. The UV light source may incorporate a protective housing and shutter 740 apparatus to protect the UV light source from the coating chemicals. The chamber 710 may also provide an inlet 750, outlet 760, and valve 770 to allow gases to pass through the chamber when desired. In a surface activation phase, the chamber 710 may provide space for placing the substrates 730, UV lamps 720, a shutter 740 and a control valve 770. Carrier gas such as but not limited to the pure form or a mixture of hydrogen ($H_2$), helium (He), nitrogen ($N_2$), oxygen ($O_2$), argon (Ar), halogens ($F_2$ and $Cl_2$), carbon dioxide ($CO_2$), hydrocarbons (methane, ethane, propane and ethylene) or compressed dry air (a mixture of 20% $O_2$ and 80% $N_2$) flows into the chamber 70 through the inlet 750. In order to increase the efficiency of ozone generation, UV lamps and/or surface activation supply gas may be used. Nonlimiting examples of the surface activation supply gas may be oxygen ($O_2$) or compressed dry air (a mixture of 20% $O_2$ and 80% $N_2$). The surface activation supply gas is used to generate active chemical species such as but not limited to ozone and oxygen radicals. In some embodiments, during the surface activation phase, a flow of surface activation supply gas passes through the chamber 710 while the UV lamps 720 are on with the shutter 740 opened and the valve 770 closed. The active chemical species activate the target surface to facilitate the surface chemical reactions during the deposition phase.

During the deposition phase shown in FIG. 7b, a carrier gas with reactive chemicals (from the coating chemical reactor e.g. FIG. 5) is passed through the chamber 710 over the target surface 730 from the inlet 750 to outlet 760. For the purposes of illustration, such a chamber 710 would be a combined surface activation and deposition chamber. In some embodiments, the surface activation chamber and deposition chamber may be combined. In other embodiments, the surface activation apparatus and deposition chamber may be separated. During the deposition phase, the UV lamps 720 are off with the shutter closed 740 and valve 770 opened. This setup prevents the reactive chemicals from reacting with the surface of the UV lamps 730. In embodiments, with a separated surface activation apparatus and deposition chamber, the UV lamps 730 and shutter 740 may not be present in a deposition chamber.

Figure 8:
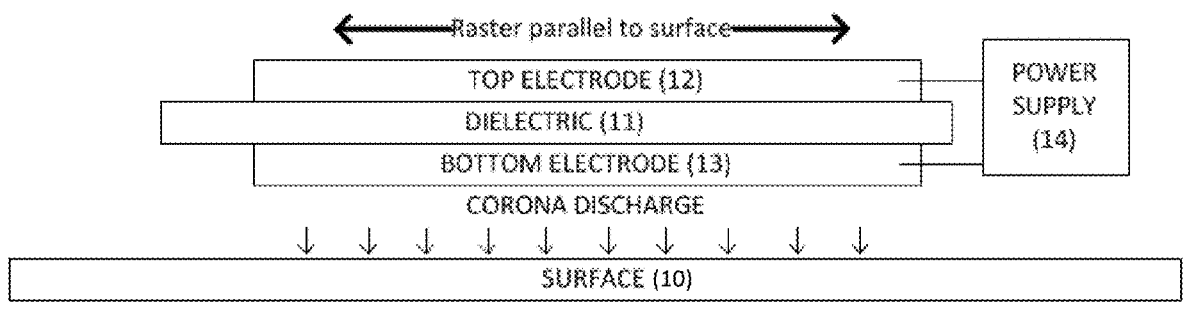
FIG. 8 is an illustrative embodiment of a surface activation apparatus based on an ozone generator.
Figure 9:
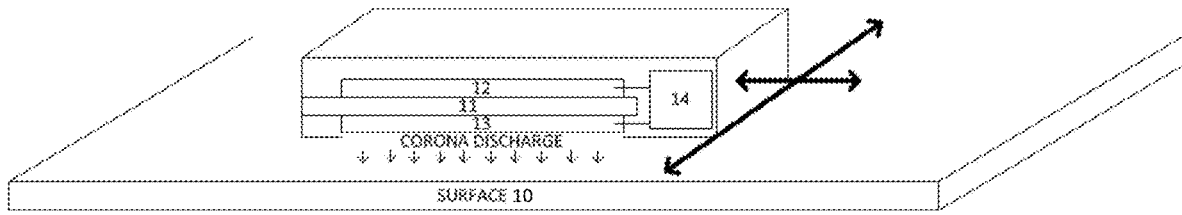
FIG. 9 is an illustrative embodiment of the motion of the treatment head with respect to the target surface to allow for an automated system.
Figure 10:
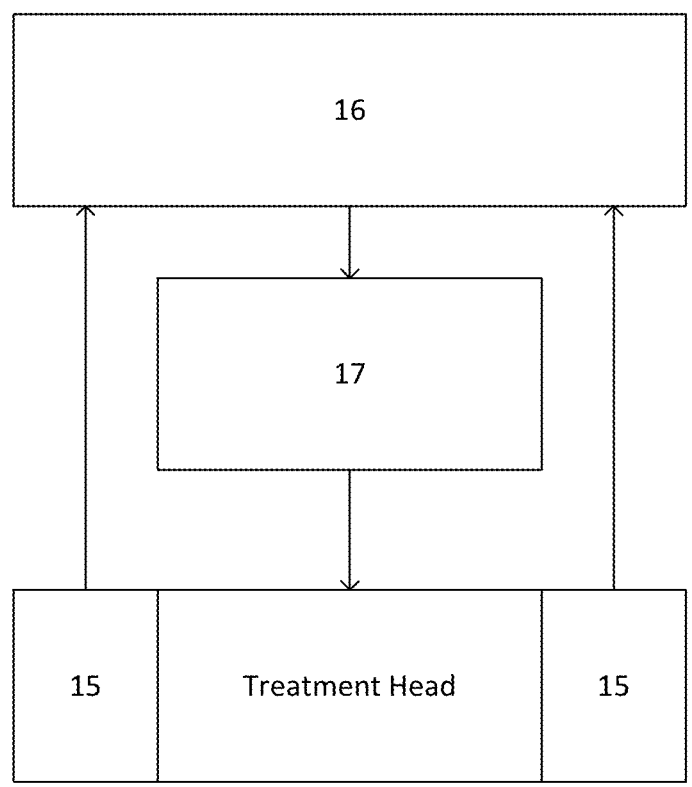
FIG. 10 is an illustrative embodiment of a layout of electronic controls for a treatment head system.

FIGS. 8-10 are illustrative embodiments of a surface activation apparatus. As a nonlimiting example, surface activation may be achieved via plasma treatment, whereby plasma comprising any suitable element(s) is allowed to come into contact with the target surface (10). Surface activation may be also achieved via ozone generation in proximity to a corona discharge. This may be achieved by the incorporation of the moveable treatment head that may provide a dielectric (11), top electrode (12), bottom electrode (13), power supply (14), sensors (15), microcontroller (16), and actuator (17). Surface activation may be achieved via introduction or removal of charges due to an externally applied electric field (i.e. static charging bar, point source, or the like). FIG. 8 is an illustrative embodiment of a surface activation apparatus based on an ozone generator utilizing corona discharge to produce cold plasma. When a surface (10) is in close proximity to the electrodes (12, 13) it is exposed to the generated ozone and cold plasma which is highly reactive and serves to activate the surface. In the case of a glass surface, the bonds at the surface are broken yielding highly reactive sites. A controlled corona discharge is obtained by placing an insulator (or dielectric) (11) material between two electrodes (12, 13). A high frequency (equal to or between approximately 1,000-20,000 Hz), alternating current (AC) at high voltages ((equal to or between approximately 1000-30000 V) is applied across the dielectric using two electrodes using a power supply (14). By modifying the electrode geometries it is possible to control the direction/location of the corona discharge such that the bottom electrode (13) is most active in the system and as such the target substrate (10) is placed under the bottom electrode to be exposed to the corona discharge and become activated. The top electrode (12) may provide of a planar flat geometry, whilst the bottom electrode provides of numerous finely spaced ((equal to or between approximately 0.1 mm-5 mm) lines ranging in width ((equal to or between approximately 0.1 mm to 1 cm) spread out across the area spanned by the corresponding top electrode. In some embodiments, the dielectric (11) is chosen to be glass or ceramic, whereas ceramic is preferred as it withstands localized temperature changes without shattering. The top and bottom electrodes (12, 13) are typically made of a metal or metal alloy (aluminum, copper, silver, gold, stainless steel, nickel, or the like) such that it may withstand the conditions of the system such as a high concentration ozone environment. In order to activate larger areas, the ozone generator can be incorporated into a moveable treatment head, such as a raster, capable of travelling across the entire target surface by means of at least two directions or movement.

FIG. 9 is an illustrative embodiment of the motion of the treatment head with respect to the target surface to allow for an automated system. The arrows indicate the movement of travel for the treatment head. The treatment head may be translated across the target surface by means of an electronic motor attached to a system of pulleys, belts, driving wheels, gears, any other suitable actuators, or combinations thereof. Linear actuators in the form of a gantry system may also be incorporated for this task. The system may also have a sensor to feedback and control the height of the treatment head from the surface (10) being activated.

FIG. 10 is an illustrative embodiment of a layout of electronic controls for a treatment head system. The movable treatment head has sensors (15) that enable it to detect when to the change direction of travel. The sensors (15) provide feedback to the microcontroller (16) which then computes the next movement of the treatment head by giving the appropriate signal to the actuator (17). The sensors (15) can be optical, electronic, mechanically based systems, or a combination thereof. The microcontroller may be initially programmed using a computer interface or by an attached visual basic interface, and subsequently independently powered acting as an autonomous system.

Figure 11A:
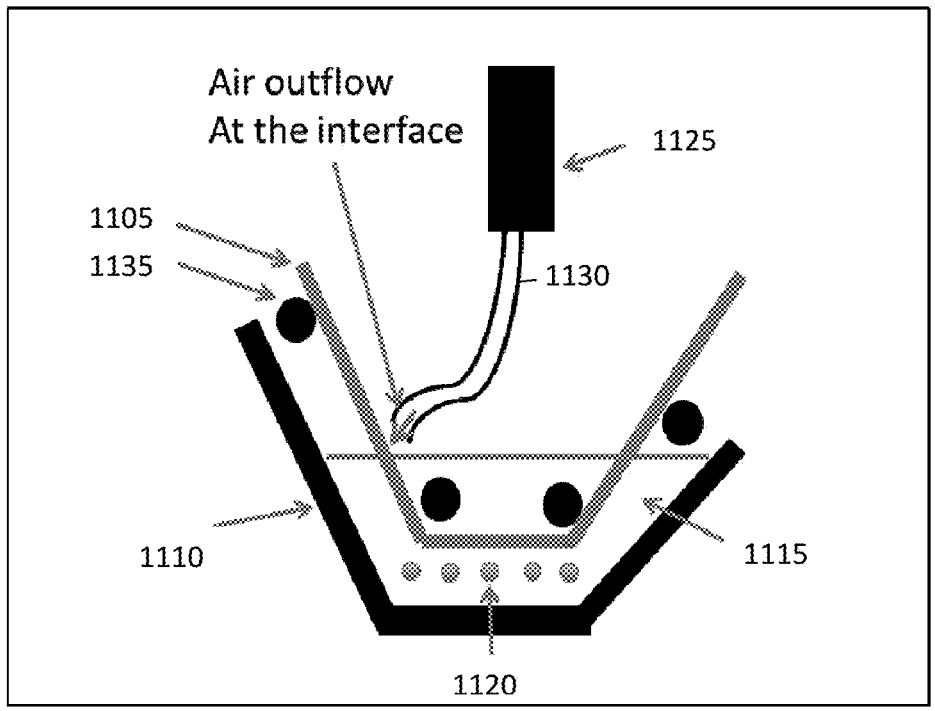
FIGS. 11A-11D are illustrative embodiments of a mass solution treatment system.
Figure 11B:
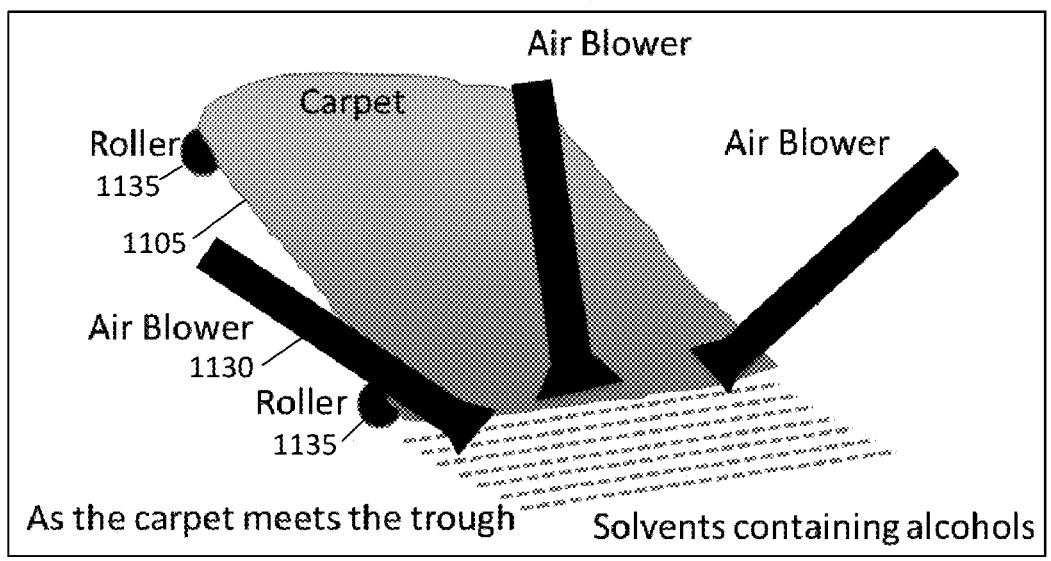
Figure 11C:
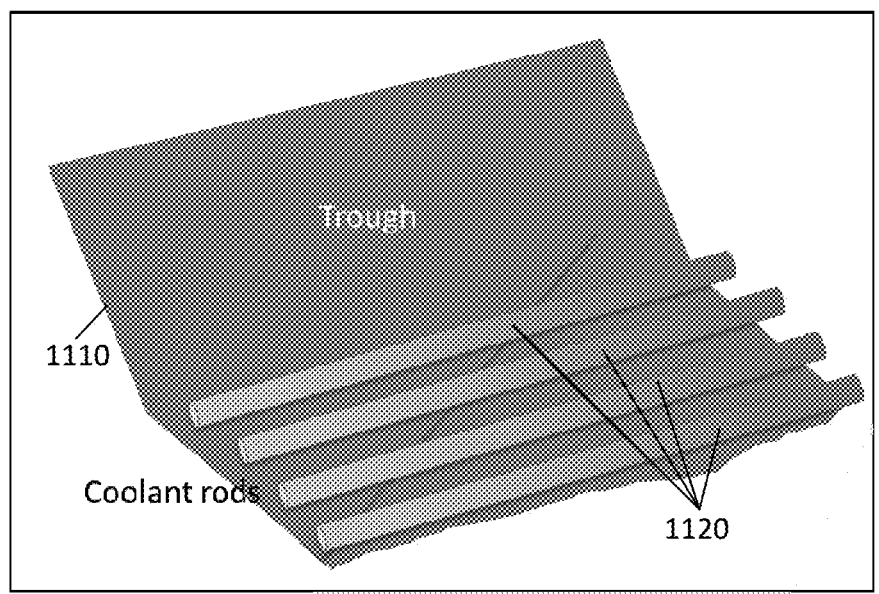

In some embodiments, the substrates may be subjected to a solution treatment before coating in the coating apparatus. FIGS. 11A-11D are illustrative embodiments of such mass solution treatment systems which are designed for, but not limited to, carpet and textile industries. FIG. 11A is an illustrative embodiment of a solution treatment system where the carpet or textile 1105 is passing through a trough 1110 filled with the treatment solution 1115. The solution 1115 is kept at a low temperature below the flash point of the solvents to prevent vapor build-up by a set of coolant rods 1120. As shown in the enlarged view in FIG. 11C, trough 1110 provides one or more coolant rods 1120. For example, the solution is kept below 9° C. for a solution containing ethanol and other alcohols. As shown in the enlarged view of FIG. 11B, an air/gas delivery system comprised of air handlers 1125 and pipes 1130 is designed to keep the interface cold and reduce the concentration of solvent vapor by blowing cold or inert gas (such as Nitrogen or Argon). In some embodiments, the pipes 1130 blow air at the interface where the carpet 1105 enters the treatment solution. One or more grounded metal rollers 1135 are positioned before the carpet 1105 enters the solution 1115 to prevent the potential of static electricity build-up on the substrate which can cause a flash.

Figure 11D:
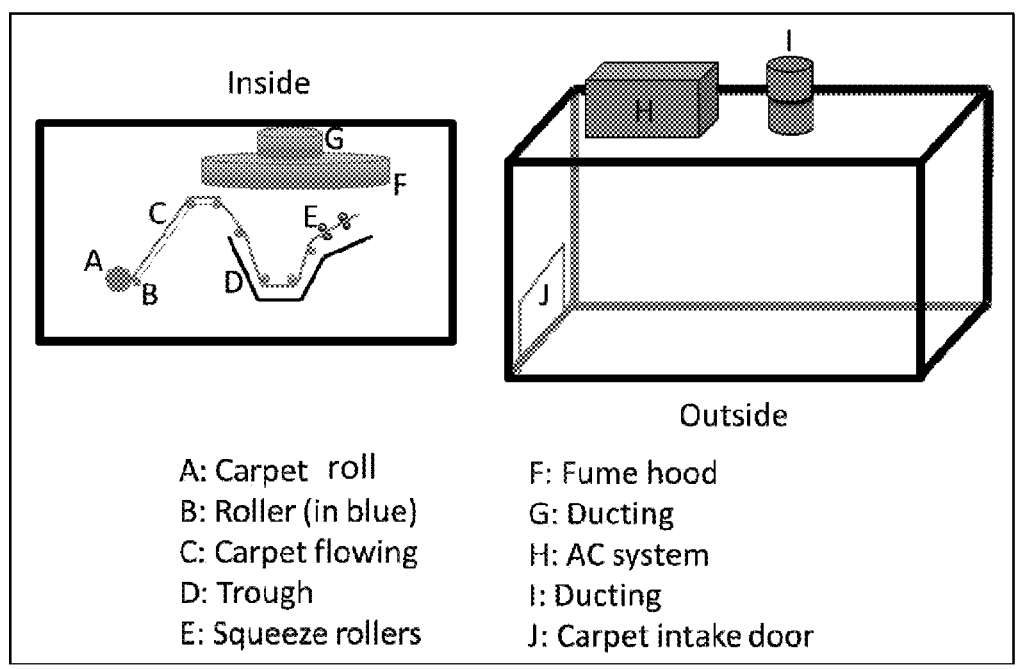

Referring to FIG. 11D, the chamber for the solution treatment system is designed to contain the 'wetting' compartment of the substrate at a cool temperature, but also contains a ventilation system to capture any residue gas vapor build-up and re-condense the vapor to solvents that can be added back to the supply. Carpet roll A is positioned on rollers B that direct the carpet C through the solution treatment solution in trough D. Once carpet C exits the trough D, squeeze rollers E wring any excess solution from the carpet. The chamber may also provide a fume hood F and ducting G to capture any residue gas vapor. Outside of the chamber ducting I may provide residue gas vapor to AC system H, which re-condenses the vapor to solvents. Carpet intake door J allows the carpet C to be placed into the chamber.

In general the portable coating apparatus may operate as follows:

A specific coating chemical or a combination of chemicals is sourced. In some embodiments, the chemicals may be placed in a coating chemical reservoir cartridge.

The coating chemical dispenser is set to deliver the desired amount of material to the coating chemical reactor.

The target surface may be treated by a surface activation apparatus related to one of the processes described above for the deposition chamber (9) or the combined surface activation and deposition chamber (10).

The raw carrier gas or a different venting gas may optionally be used to prime the deposition chamber (9) or the combined surface activation and deposition chamber (10) before the introduction of the coating chemical.

For the case of a gaseous phase coating chemical application, the coating chemical vapor is transported by a carrier gas along the one directional supply line (e.g. highly chemically resistant PTFE) into the desired deposition chamber (9) or the combined surface activation and deposition chamber (10).

Once this process is completed, the deposition chamber (9) may be vented again to finish the coating procedure. In the case of combined surface activation and deposition chamber (10) it may also be vented again to allow the removal of the target surface(s). While the process is described in a particular order above, in other embodiments, the order of the steps may be varied or steps may be combined.

Experimental Example

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

In the following example, the process demonstrates how the coating apparatus is used to produce a coating exhibiting self-cleaning properties on glass. However, it will be understood by those of ordinary skill in the art that the coating apparatuses discussed herein are not specifically limited to coating glass. A plain glass substrate is first cleaned with soap water and washed with de-ionized water thoroughly. After drying, the glass is transferred into a combined deposition chamber and surface activation apparatus at room temperature with relative humidity level of 16%. The glass surface is activated inside the combined surface activation and deposition chamber via ozone plasma generated by intense UV light source in the vicinity of the glass surface for 5 to 30 minutes. A solution of trichloro(1H,1H,2H,2H-perfluorooctyl)silane in anhydrous hexane is introduced into the coating chemical reactor through a coating chemical dispenser and a coating chemical verification apparatus. A carrier gas (compressed air) with reactive chemicals vapor is passed through the chamber over the glass surface. After 5 to 30 minutes, the glass is removed from the combined deposition chamber and surface activation apparatus. The treated glass is cleaned with soap water and washed with de-ionized water thoroughly. The transmission of the resulting coating at the visible light range is expected to remain the same as pristine glass (the difference of transmission is below the errors of a common UV-vis spectrometer). The critical angle for a 0.05 mL sessile drop of de-ionized water to sliding down the coated surface will be ~20°.

In the following example, the process demonstrates how the coating apparatus is used to produce a coating exhibiting self-cleaning properties on polished aluminum. However, it will be understood by those of ordinary skill in the art that the coating apparatuses discussed herein are not specifically limited to coating aluminum. A plain aluminum plate is polished first with abrasives until the surface becomes reflective. The polished aluminum plate is cleaned with soap water and washed with de-ionized water thoroughly. After drying, the aluminum plate is transferred into a combined deposition chamber and surface activation apparatus at room temperature with relative humidity level of 16%. The aluminum surface is activated inside the combined surface activation and deposition chamber via ozone plasma generated by intense UV light source in the vicinity of the glass surface for 5 to 30 minutes. A solution of trichloro(1H,1H, 2H,2H-perfluorooctyl)silane in anhydrous hexane is introduced into the coating chemical reactor through a coating chemical dispenser and a coating chemical verification apparatus. A carrier gas (compressed air) with reactive chemicals vapor is passed through the chamber over the aluminum surface. After 5 to 30 minutes, the aluminum plate is removed from the combined deposition chamber and surface activation apparatus. The treated aluminum plate is cleaned with soap water and washed with de-ionized water thoroughly. The reflectivity of the resulting coating at the visible light range is expected to remain the same as pristine aluminum (the difference of reflectivity cannot be distinguished by common eyes). The critical angle for a 0.05 mL sessile drop of de-ionized water to sliding down the coated surface will be ~20°.

While the invention described herein specifically focuses on coating apparatus used to deposit various organic, inorganic or hybrid material systems in solid, solution, or vapor phase as coatings, one of ordinary skills in the art with the benefit of this disclosure would recognize the extension of such approaches to other systems.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A method for depositing a coating, the method comprising:
   activating a surface of the substrate with a surface activator, wherein surface activator generates ozone, oxygen, hydrogen peroxide, halogens, or other oxidizing species that render the surface energetically reactive after treatment;
   preparing coating chemicals with a coating reactor for coating the substrate with a desired coating, wherein the coating reactor comprises a dispenser supplying the coating chemicals and a chemical verifier validating the coating chemicals;
   validating the coating chemicals to ensure correct, desired chemicals are supplied for the desired coating;
   coating the surface with the desired coating, wherein the surface covalently binds with molecules of the coating chemicals;
   exciting the coating chemicals and monitoring optical absorption or optical intensity with at least one optical detector; and
   digitizing an optical profile detected by the at least one optical detector into a binary code that represents the optical profile of the coating chemicals, wherein the optical profile is divided into a grid pattern, any grid squares with a majority of its area above a curve of the optical profile are assigned a "0" value, and any other grid squares with a majority of its area below the curve are assigned a "1" value.

2. The method of claim 1, wherein the activating and coating steps are both performed in a combined surface activation and deposition chamber.

3. The method of claim 1, wherein the coating step is performed in a first chamber and the activating step is performed in a second chamber separate from the first chamber.

4. The method of claim 1, further comprising the step of venting during the activating or coating step to control an environment during the activating or coating step.

5. The method of claim 1, further comprising removing unwanted by products during the activating or coating step with one or more filters.

6. The method of claim 1, wherein the coating chemicals have a general formula of fluoroalkylsilane $[CF_3(CF_2)_a(CH_2)_b]_cSiX_{4-c}$ (where a=0, 1, 2, ... to 20, b=0, 1, 2, ... to 10, c=1, 2 or 3; X=Cl, Br, I or other suitable organic leaving groups); fluoroalkylsilane $[CF_3(CF_2)_a(CH_2)_b]_cSiX_{4-c}$ (where a=0, 1, 2, ... to 20, b=0, 1, 2, ... to 10, c=1, 2 or 3; X=Cl, Br, I or other suitable organic leaving groups); a general formula of alkylsilane $[CH_3(CH_2)_a]_bSiX_{4-b}$ (where a=0, 1, 2, ... to 20, b=1, 2 or 3; X=Cl, Br, I or other suitable organic leaving groups); alkoxyfluoroalkylsilane $[CF_3(CF_2)_a (CH_2)_b]_cSi[alkoxy]_{4-c}$, (where a=0, 1, 2, ... to 20, b=0, 1, 2, ... to 10, c=1, 2 or 3; where the alkoxy group can be methoxy, ethoxy, propoxy, isopropoxy, butoxy, isobutoxy, or a combination thereof); or alkoxyalkylsilane $[CH_3(CH_2)_a]_bSi[alkoxy]_{4-c}$ (where a=0, 1, 2, ... to 20, b=0, 1, 2, ... to 10, c=1, 2 or 3; where the alkoxy group can be methoxy, ethoxy, propoxy, isopropoxy, butoxy, isobutoxy, or a combination thereof).

7. The method of claim 1, further comprising comparing the binary code to a desired code corresponding to the desired coating.

8. The method of claim 1, wherein the preparing step comprises dispensing a solvent of the coating chemicals to a heating element, wherein the heating element converts the solvent of the coating chemicals into a reactive chemical vapor.

9. The method of claim 1, further comprising transporting the substrate with a conveyor roller, wherein the conveyor roller subjects the substrate to a radius of curvature equal to or between 1 mm to 5 m during deposition.

10. The method of claim 1, further comprising transporting the substrate with a brush roller, wherein the brush roller separates fibers of the substrate during deposition.

11. The method of claim 1, further comprising supplying compressed air to the substrate with a compressed air nozzle, wherein the compressed air separates fibers of the substrate during deposition.

12. The method of claim 1, further comprising transporting the substrate with a conveyor roller and a brush roller, wherein the conveyor roller subjects the substrate to bending during deposition, and the brush roller separates fibers of the substrate during deposition.

13. The method of claim 1, wherein the surface activator comprises one or more UV light sources, and the one or more UV light sources generating ozone plasma in a vicinity of the substrate.

14. The method of claim 1, further comprising supplying surface activation gas utilized for the activating step.

15. The method of claim 1, further comprising applying an alternating current across a dielectric positioned between two electrodes to provide corona discharge near the substrate.

16. The method of claim 1, further comprising:
   transporting the substrate through a treatment solution; and
   controlling a temperature of the treatment solution with coolant rods.

17. The method of claim 16, wherein the substrate is transported with a metal roller that is grounded.

18. The method of claim 16, further comprising blowing cold gas at an interface of the substrate and treatment solution.

* * * * *